(12) United States Patent
Sun et al.

(10) Patent No.: US 11,985,844 B2
(45) Date of Patent: May 14, 2024

(54) DISPLAY SUBSTRATE PANEL AND PREPARATION METHOD THEREOF, AND DISPLAY PANEL

(71) Applicant: BOE Technology Group Co., Ltd., Beijing (CN)

(72) Inventors: Hongda Sun, Beijing (CN); Youngsuk Song, Beijing (CN); Fengjuan Liu, Beijing (CN); Zhen Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 198 days.

(21) Appl. No.: 16/764,885

(22) PCT Filed: Dec. 23, 2019

(86) PCT No.: PCT/CN2019/127473
§ 371 (c)(1),
(2) Date: May 18, 2020

(87) PCT Pub. No.: WO2020/147519
PCT Pub. Date: Jul. 23, 2020

(65) Prior Publication Data
US 2021/0328183 A1    Oct. 21, 2021

(30) Foreign Application Priority Data

Jan. 18, 2019 (CN) .......................... 201910046661.0

(51) Int. Cl.
*H10K 50/844* (2023.01)
*H10K 50/86* (2023.01)
(Continued)

(52) U.S. Cl.
CPC ......... *H10K 50/844* (2023.02); *H10K 50/865* (2023.02); *H10K 59/38* (2023.02); *H10K 71/00* (2023.02)

(58) Field of Classification Search
None
See application file for complete search history.

(56) References Cited

U.S. PATENT DOCUMENTS

2002/0011783 A1* 1/2002 Hosokawa ............. H05B 33/12
  313/506
2005/0139839 A1 6/2005 Park
(Continued)

FOREIGN PATENT DOCUMENTS

CN    1638562 A    7/2005
CN    102346342 A   2/2012
(Continued)

OTHER PUBLICATIONS

Liu, Yongzhi, et al., LCD Technology, Dec. 30, 2000, pp. 269-272.
(Continued)

*Primary Examiner* — Evren Seven
(74) *Attorney, Agent, or Firm* — Ling Wu; Stephen Yang; Ling and Yang Intellectual Property (57) ABSTRACT

A display substrate panel includes a substrate and multiple OLED elements disposed on the substrate, and further includes a thin film encapsulation layer disposed on the OLED elements and a light blocking layer disposed on the thin film encapsulation layer and located between two adjacent OLED elements. A display panel includes the above display substrate panel and a cover panel which is aligned and combined into a cell with the display substrate panel, wherein the cover panel includes a color film layer, and the color film layer has a red color film, a green color film and a blue color film which are disposed to correspond to the OLED elements.

4 Claims, 5 Drawing Sheets

(51) Int. Cl.
*H10K 59/38* (2023.01)
*H10K 71/00* (2023.01)

(56) References Cited

U.S. PATENT DOCUMENTS

| | | | |
|---|---|---|---|
| 2010/0072880 A1 | 3/2010 | Adachi et al. | |
| 2010/0097295 A1* | 4/2010 | Kwak | H01L 51/5284 345/32 |
| 2012/0033169 A1 | 2/2012 | Lee | |
| 2014/0145159 A1* | 5/2014 | Kim | H01L 27/322 257/40 |
| 2014/0284572 A1* | 9/2014 | Oooka | H01L 51/5203 257/40 |
| 2015/0371573 A1* | 12/2015 | Choi | G09G 3/3225 345/206 |
| 2016/0005790 A1* | 1/2016 | Li | G02F 1/13394 257/89 |
| 2016/0365386 A1* | 12/2016 | Liu | H01L 27/322 |
| 2017/0125508 A1* | 5/2017 | Kim | H10K 50/824 |
| 2018/0068626 A1 | 3/2018 | Zhao et al. | |
| 2018/0151842 A1* | 5/2018 | Park | H01L 51/525 |
| 2021/0050394 A1* | 2/2021 | Zhao | H01L 51/56 |

FOREIGN PATENT DOCUMENTS

| | | |
|---|---|---|
| CN | 103855314 A | 6/2014 |
| CN | 106125438 A | 11/2016 |
| CN | 106646975 A | 5/2017 |
| CN | 109638177 A | 4/2019 |

OTHER PUBLICATIONS

International Search Report for PCT/CN2019/127473 dated Mar. 23, 2020.
Office Action dated Jan. 19, 2020 for Chinese Patent Application No. 201910046661.0 and English Translation.
Office Action dated Aug. 4, 2020 for Chinese Patent Application No. 201910046661.0 and English Translation.
Office Action dated Nov. 3, 2020 for Chinese Patent Application No. 201910046661.0 and English Translation.
Office Action dated May 31, 2021 for Chinese Patent Application No. 201910046661.0 and English Translation.

* cited by examiner

DISPLAY SUBSTRATE PANEL AND PREPARATION METHOD THEREOF, AND DISPLAY PANEL

CROSS-REFERENCE TO RELATED APPLICATIONS

The present disclosure is a U.S. National Phase Entry of International PCT Application No. PCT/CN2019/127473 having an international filing date of Dec. 23, 2019, which claims a priority to Chinese Patent Application No. 201910046661.0, entitled "Display Substrate Panel and Preparation Method Thereof, and Display Panel" filed on Jan. 18, 2019 by BOE Technology Group Co., Ltd. The above-identified applications are incorporated by reference herein in their entirety.

TECHNICAL FIELD

Embodiments of the present application relate to but are not limited to the technical field of display, in particular to a display substrate panel and a preparation method thereof, and a display panel.

BACKGROUND

At present, display devices appearing in the display market and the daily life of the public are in increasingly diversified and novel forms. Display devices include the Liquid Crystal Display (LCD), of which the technology is fairly mature and is developing toward ultra-high resolution, small and medium-sized organic light-emitting diode (OLED) display devices widely applied in portable apparatuses such as mobile phones and Pads, etc., and increasingly mature large-sized organic light-emitting diode (OLED) display devices used in TVs. In addition, with the development of the information society, novel display technologies such as transparent display devices, etc. have got good user experiences and have broad market prospects.

In a display device, a top emission structure has characteristics of a large luminous area, high brightness and low power consumption, and particularly for the large-size OLED display device, the top emission structure is more widely applied.

An existing display device has color deviation in display effect, resulting in a phenomenon of color cast.

SUMMARY

The following is a summary of subject matter described in detail herein. This summary is not intended to limit the scope of protection of the claims.

In one aspect, an embodiment of the present application provides a display substrate panel, including a substrate and multiple OLED elements disposed on the substrate, wherein the display substrate panel further includes a thin film encapsulation layer disposed on the OLED elements and a light blocking layer disposed on the thin film encapsulation layer and located between two adjacent OLED elements.

In some possible implementations, thickness of the light blocking layer is less than or equal to 1.5 um.

In some possible implementations, the display substrate panel further includes metal traces located between two adjacent OLED elements and disposed between the OLED elements and the substrate, and an orthographic projection of the light blocking layer on the substrate includes an orthographic projection of the metal traces on the substrate.

In some possible implementations, an orthographic projection of the OLED element, which is adjacent to a region where the light blocking layer is located, on the substrate is connected to or has an overlapping part with an orthographic projection of the light blocking layer on the substrate.

In another aspect, an embodiment of the present application further provides a display panel, including the above display substrate panel and a cover panel which is aligned and combined into a cell with the display substrate panel, wherein the cover panel includes a color film layer, and the color film layer has a red color film, a green color film and a blue color film which are disposed to correspond to the OLED elements.

In some possible implementations, an isolation column is disposed between the display substrate panel and the cover panel, wherein an orthographic projection of the isolation column on the substrate is within a range of an orthographic projection of the light blocking layer on the substrate.

In some possible implementations, the cover panel further includes a black matrix located between adjacent color films in the color film layer.

In yet another aspect, an embodiment of the present application further provides a preparation method for a display substrate panel, including: forming multiple organic light-emitting diode (OLED) elements on a substrate; forming a thin film encapsulation layer on the OLED elements; and forming a light blocking layer on the thin film encapsulation layer, wherein the light blocking layer is located between two adjacent OLED elements.

In some possible implementations, the light blocking layer is formed at a process temperature less than or equal to 100° C.

In some possible implementations, forming the light blocking layer on the thin film encapsulation layer includes: forming a light blocking thin film on the thin film encapsulation layer; and performing exposure and development of the light blocking thin film by using a single-tone mask, to form a pattern of the light blocking layer.

Other features and advantages of the present application will be set forth in the description which follows, and in part will become apparent from the description, or may be learned by practice of the present application.

Other aspects will become apparent upon reading and understanding accompanying drawings and the detailed description.

BRIEF DESCRIPTION OF DRAWINGS

Accompanying drawings are used to provide a further understanding of technical solutions of the present application and form a part of the specification. Together with embodiments of the present application, they are used to explain technical solutions of the present application and do not constitute a limitation on the technical solutions of the present application.

DESCRIPTION OF THE REFERENCE SIGNS

| | | |
|---|---|---|
| 11-Substrate; | 12-Thin film transistor; | 13-Gate insulation layer; |
| 14-Interlayer insulation layer; | 15-Passivation layer; | 16-Flat layer; |
| 17-Pixel defining layer; | 18-OLED element; | 21-Color film layer; |
| 22-Black matrix; | 23-Protective layer; | 121-Active layer; |
| 122-Gate electrode; | 123-Source electrode; | 124-Drain electrode; |
| 181-First electrode layer; | 182-Second electrode layer; | 183-Organic light emitting layer; |
| 19-Thin film encapsulation layer; | 100-Display substrate panel; | 200-Cover panel; |
| 300-Isolation column; | 30-Light blocking layer. | |

DETAILED DESCRIPTION

Hereinafter, embodiments of the present application will be described in detail with reference to the accompanying drawings. Without conflict, embodiments in the present application and features in the embodiments may be combined with each other arbitrarily. One of ordinary skill in the art should understand that technical solutions of the present application may be modified or replaced equally without departing from the spirit and the scope of the technical solutions of the present application, which should be covered by the scope of the claims of the present application.

A top emission OLED display panel includes a display substrate panel and a cover panel, the display substrate panel is provided with multiple OLED elements, and the cover panel and the display substrate panel are aligned and combined into a cell. When the OLED element emits light, there is light leakage among adjacent pixels, which causes that color deviation appears in pixel display, resulting in color cast. In the process when the cover panel and the display substrate panel are aligned and combined into a cell, there is often a slight deviation caused by encapsulation and alignment, or a product design requires that there is a slight deviation in alignment of the cover panel and the display substrate panel, which makes the color cast more serious.

Figure 1:
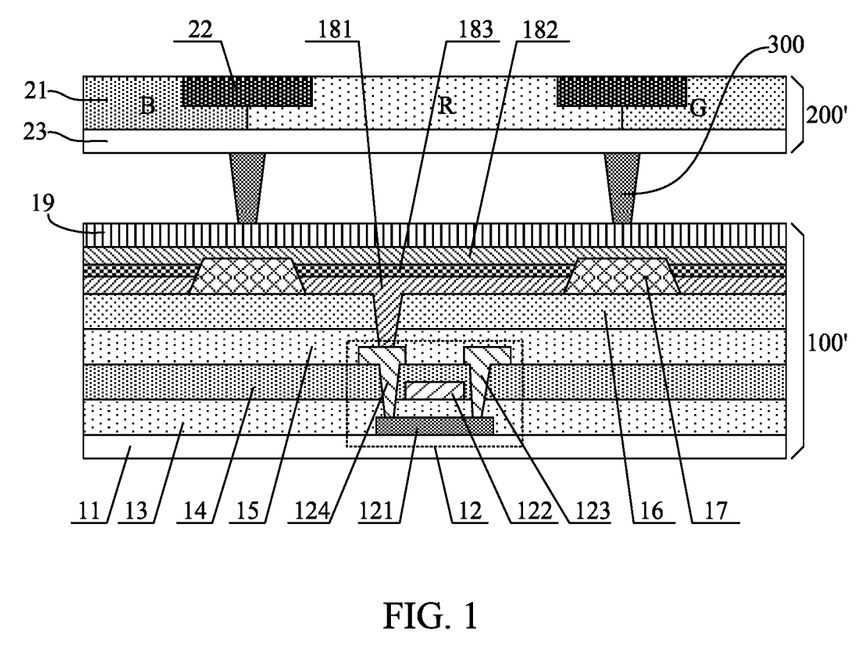
FIG. 1 is a schematic diagram of sectional structure of an OLED display panel.

FIG. 1 is a schematic diagram of sectional structure of an OLED display panel. The OLED display panel includes a display substrate panel 100' and a cover panel 200' which are aligned and combined into a cell. In order to make the display panel maintain a certain thickness, the display panel further includes an isolation column 300 located between the display substrate panel 100' and the cover panel 200'. The display substrate panel 100' includes a substrate 11 and a thin film transistor 12 disposed on the substrate 11. The thin film transistor 12 includes an active layer 121, a gate electrode 122, a source electrode 123, and a drain electrode 124. In FIG. 1, the thin film transistor 12 is a top-gate thin film transistor. A light shielding layer and a buffer layer (not shown in the figure) are disposed on the substrate 11, the active layer 121 is disposed on the buffer layer, a gate insulating layer 13 is disposed on the active layer 121, the gate electrode 122 is disposed on the gate insulating layer 13, an interlayer insulating layer 14 is disposed on the gate electrode 122, and the source electrode 123 and the drain electrode 124 are disposed on the interlayer insulating layer 14. Herein, a connection layer (CNT layer) (not shown in the figure) may also be disposed between the gate electrode 122 and the interlayer insulating layer 14. A passivation layer 15 and a flat layer 16 are sequentially disposed on the source electrode 123 and the drain electrode 124. The display substrate panel 100' further includes a pixel defining layer 17 disposed on the flat layer 16, multiple light emitting regions are defined in the pixel defining layer 17, and the light emitting regions correspond to the thin film transistors 12 one by one. The display substrate panel 100' further includes a first electrode layer 181 located in the light emitting region, wherein the first electrode layer 181 is disposed on the flat layer 16 and electrically connected to the corresponding thin film transistor 12 through a hole. The display substrate panel 100' further includes an organic light emitting layer 183 disposed on the first electrode layer 181 and a second electrode layer 182 located on the organic light emitting layer 183. Generally, the first electrode layer 181 is an anode layer, and the second electrode layer 182 is a cathode layer. The first electrode layer 181 located in the light emitting region, the organic light emitting layer 183, and the second electrode layer 182 form an OLED element. In order to enhance the oxygen and moisture resistance of a display substrate panel, the display substrate panel 100' further includes a thin film encapsulation layer 19 disposed on the second electrode layer 182. In FIG. 1, OLED elements correspond to light emitting regions one by one, and one OLED element forms one pixel.

There are mainly two kinds of colorization technologies for OLED display panels. In one of them, R, G and B pixels emit light independently, and in the other one, color films are used. In order to reduce the cost of the OLED display panel, in FIG. 1, the OLED elements located in the light emitting regions all emit white light when operating. In order to colorize the OLED display panel, the cover panel 200' includes a second substrate (not shown in the figure), a color film layer 21 disposed on the second substrate, and a black matrix 22 located between adjacent color films. The color film layer 21 includes a red color film (R), a green color film (G), and a blue color film (B) disposed to correspond to the light emitting regions, thus a red pixel, a green pixel, and a blue pixel corresponding to the light emitting regions are formed on the display panel. When an OLED element emits white light, the white light passes through the color film, and a corresponding pixel displays a corresponding color, thus achieving color display. The cover panel 200' further includes a protective layer 23 on a side of the color film layer 21 facing the display substrate panel 100'.

Figure 2:
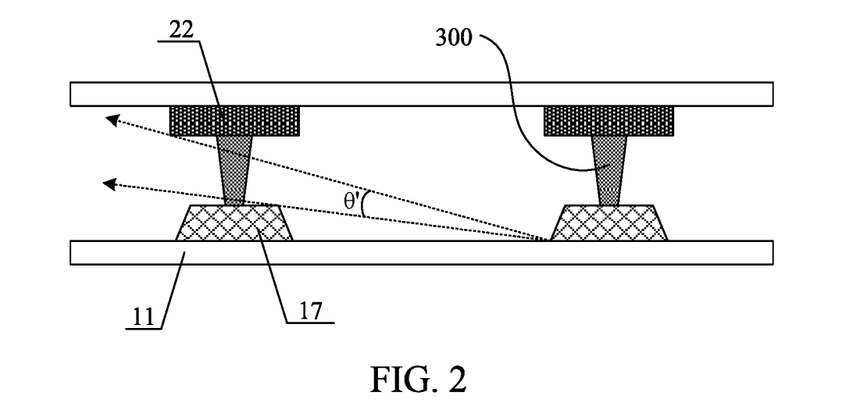
FIG. 2 is a simplified schematic diagram of a light emitting direction of an OLED element of the OLED display panel shown in FIG. 1.

FIG. 2 is a simplified schematic diagram of the light emitting direction of the OLED element of the OLED display panel shown in FIG. 1. The OLED display panel in FIG. 1 has a top emission structure. Due to the limitation of the top emission structure, the display panel often has a problem of a narrow viewing angle. As shown in FIGS. 1 and 2, the cover panel 200' is provided with the black matrix 22. The black matrix 22 is far away from the OLED element. When the OLED element emits light, the light emitted by the OLED element will shine on adjacent pixels and leak out from the adjacent pixels. As shown in FIG. 2, a light leakage angle is θ', and it makes the pixels have color deviation and causes color cast. When viewing the display panel from a side direction, it will be seen that adjacent pixels have relatively serious light leakage. When there is a location alignment deviation between the display substrate panel 100' and the cover panel 200', the color cast will be more serious. In addition, when viewing the display panel from the side direction, since the black matrix 22 is far away from the display substrate panel, metal traces between adjacent pixels on the display substrate panel often reflect light and thus are exposed, and this reduces a visual experience of the display panel.

In one aspect, an embodiment of the present application provides a display substrate panel.

The display substrate panel includes a substrate and multiple OLED elements disposed on the substrate, and further includes a thin film encapsulation layer disposed on the OLED elements and a light blocking layer disposed on the thin film encapsulation layer and located between two adjacent OLED elements.

According to the display substrate panel provided by the embodiment of the present application, a light blocking layer located between two adjacent OLED elements is disposed on the thin film encapsulation layer. The light blocking layer may block light from passing through, so that the light blocking layer may play a role of a black matrix. Compared with a black matrix of a cover panel, the light blocking layer is disposed on the display substrate panel and is closer to the OLED elements. Therefore, the light blocking layer may more effectively separate two adjacent OLED elements so as to separate adjacent light emitting regions, and thereby may separate adjacent pixels. The light blocking layer is disposed on the display substrate panel and is closer to the OLED elements, and this makes a light leakage angle at which light emitted by the OLED elements shines on adjacent pixels greatly reduced, reduces color deviation of the pixels and reduces color cast.

In another aspect, an embodiment of the present application further provides a display panel. The display panel includes the above display substrate panel and a cover panel which is aligned and combined into a cell with the display substrate panel. The cover panel includes a color film layer, and the color film layer has a red color film, a green color film and a blue color film which are disposed to correspond to the OLED elements.

According to the display panel provided by the present application, a light blocking layer is disposed on the display substrate panel. The light blocking layer may play a role of a black matrix so that the cover panel may be provided with no black matrix, and this simplifies a manufacturing procedure process of the cover panel. The light blocking layer which may play the role of the black matrix is disposed on the display substrate panel. After the cover panel and the display substrate panel are aligned and combined into a cell, even if there is a slight location alignment deviation between the cover panel and the display substrate panel, a separation role of the light blocking layer between two adjacent OLED elements will not be affected. Therefore, light emitted by the OLED elements may always shine on corresponding color films, and light leakage of adjacent pixels caused by the location alignment deviation is avoided. Therefore, the slight location alignment deviation between the cover panel and the display substrate panel does not affect the display of pixels, which makes colors displayed by the pixels purer.

Technical contents of the present application will be described in detail below through multiple embodiments. In the following embodiments, "width" refers to a size in a width direction of a paper surface in the drawing.

Figure 3:
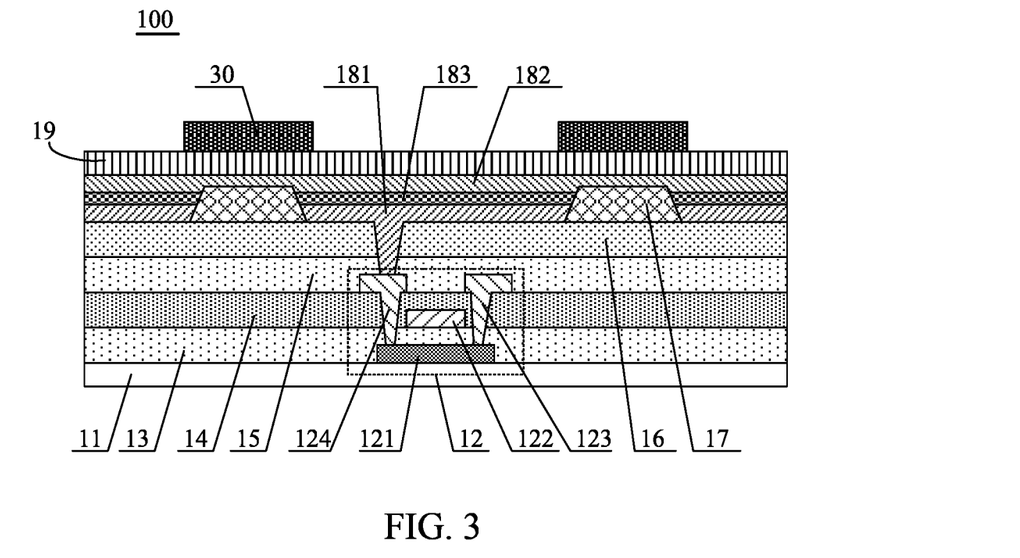
FIG. 3 is a schematic structural diagram of a display substrate panel according to an embodiment of the present application.

FIG. 3 is a schematic structural diagram of a display substrate panel according to an embodiment of the present application. As shown in FIG. 3, a display substrate panel 100 includes a substrate 11 and multiple OLED elements 18 disposed on the substrate 11. The display substrate panel 100 further includes a thin film encapsulation layer 19 and a light blocking layer 30. The thin film encapsulation layer 19 is disposed on the OLED elements 18, the light blocking layer 30 is disposed on the thin film encapsulation layer 19, and the light blocking layer 30 is located between two adjacent OLED elements 18, wherein the light blocking layer 30 may block light from passing through.

Figure 4:
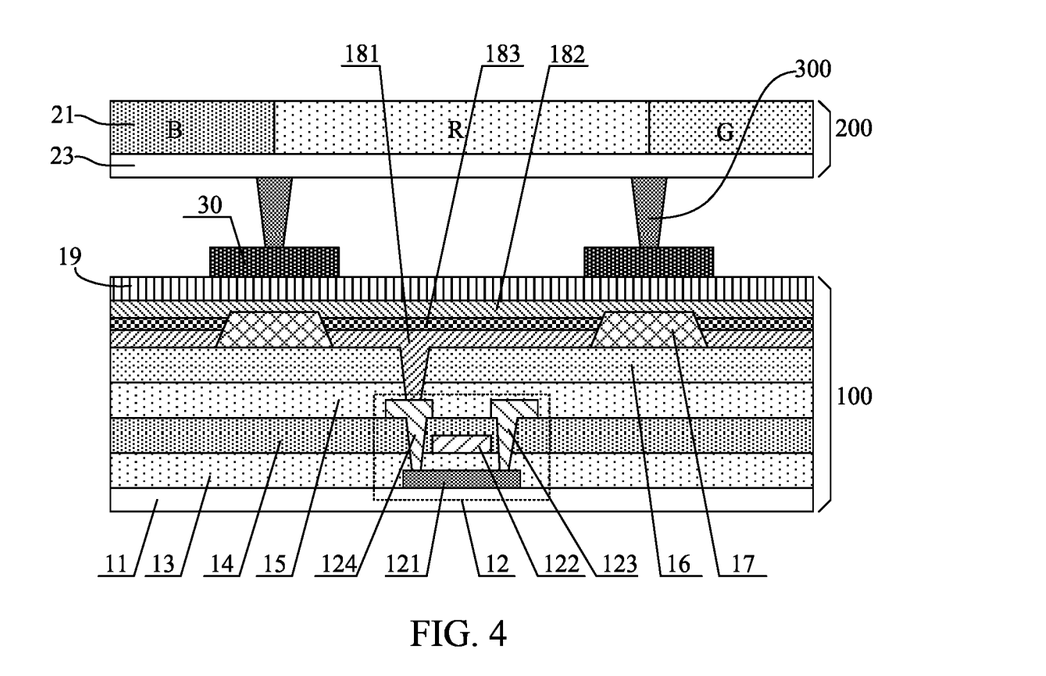
FIG. 4 is a schematic structural diagram of a display panel including the display substrate panel shown in FIG. 3.
Figure 5:
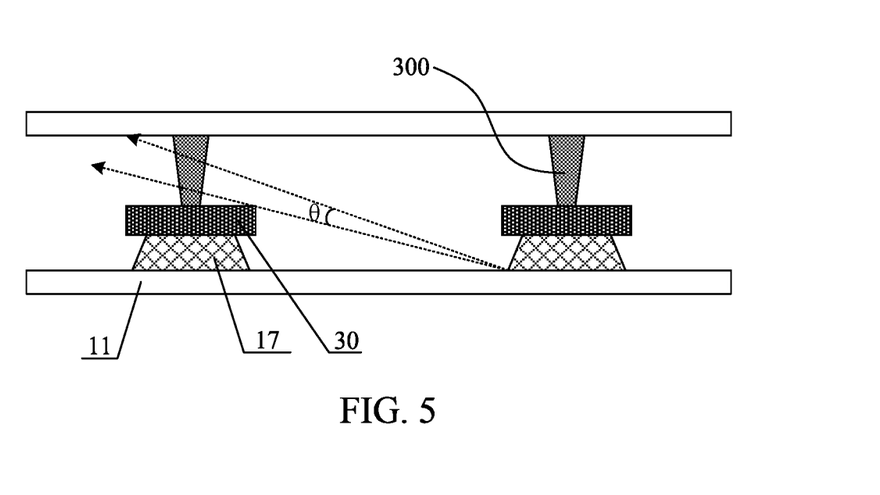
FIG. 5 is a simplified schematic diagram of a light emitting direction of an OLED element of the display panel shown in FIG. 4.

FIG. 4 is a schematic structural diagram of a display panel including the display substrate panel shown in FIG. 3. FIG. 5 is a simplified schematic diagram of a light emitting direction of an OLED element of the display panel shown in FIG. 4. As shown in FIG. 4, the display panel includes a display substrate panel 100 and a cover panel 200. The cover panel 200 and the display substrate panel 100 are aligned and combined into a cell. The cover panel 200 includes a color film layer 21. The color film layer 21 includes a red color film (R), a green color film (G), and a blue color film (B) disposed to correspond to light emitting regions, therefore pixels corresponding to the light emitting regions are formed on the color film layer 21.

According to the display substrate panel provided by the embodiment of the present application, a light blocking layer 30 located between two adjacent OLED elements 18 is disposed on the thin film encapsulation layer 19. The light blocking layer 30 may block light from passing through, so that the light blocking layer 30 may play a role of a black matrix. Compared with the black matrix 22 of the cover panel in FIG. 1, the light blocking layer 30 is disposed on the display substrate panel and is closer to the OLED elements. Therefore, the light blocking layer 30 may more effectively separate two adjacent OLED elements so as to separate adjacent light emitting regions, and thereby may separate adjacent pixels. As shown in FIG. 5, when the OLED element emits light, the light emitted by the OLED element will shine on adjacent pixels and leak out from the adjacent pixels. The light blocking layer 30 is disposed on the display substrate panel 100 and is closer to the OLED elements, and this makes a light leakage angle θ at which light emitted by the OLED elements shines on adjacent pixels greatly reduced compared with a leakage angle θ' in FIG. 2, reduces color deviation of the pixels and reduces color cast.

In the display panel shown in FIG. 1, since the cover panel 200' is provided with the black matrix 22, when there is a slight location alignment deviation between the cover panel 200' and the display substrate panel 100', this will result in that the black matrix 22 cannot be strictly aligned to a center between the adjacent two OLED elements, that is, a center of the black matrix 22 cannot be located on a symmetry line of the adjacent two OLED elements. As a result, the location alignment of the OLED elements and the corresponding color films is not strict, light leakage of adjacent pixels is caused, and color cast appears. According to the display substrate panel of the embodiment of the present application, the light blocking layer 30 is disposed on the display substrate panel. When the display panel is prepared in a subsequent stage, as shown in FIG. 4, even if there is a slight location alignment deviation between the cover panel 200 and the display substrate panel, a separation role of the light blocking layer 30 between two adjacent OLED elements will not be affected. Therefore, light emitted by the OLED elements may always shine on corresponding color films, and light leakage of adjacent pixels caused by the location alignment deviation is avoided. Therefore, the slight location alignment deviation between the cover panel 200 and the display substrate panel does not affect the display of pixels, which makes colors displayed by the pixels purer.

In an exemplary embodiment, the light blocking layer 30 may be located between every two adjacent OLED elements. In an exemplary embodiment, the light blocking layer 30 may be located between part of adjacent two OLED elements.

In an exemplary embodiment, as shown in FIG. 3, the display substrate panel 100 further includes a thin film transistor 12 disposed on the substrate 11. In an exemplary embodiment, the thin film transistor 12 is a top-gate thin film transistor. The thin film transistor 12 includes an active layer 121, a gate electrode 122, a source electrode 123, and a drain electrode 124. Thin film transistors 12 are electrically connected to OLED elements 18 one by one. In an exemplary embodiment, the thin film transistor may be a bottom-gate thin film transistor.

In an exemplary embodiment, as shown in FIG. 3, a protective layer and a buffer layer (not shown in the figure) are disposed on the substrate 11, the active layer 121 is disposed on the buffer layer, a gate insulating layer 13 is disposed on the active layer 121, the gate electrode 122 is disposed on the gate insulating layer 13, a connection layer (CNT layer) (not shown in the figure) is disposed on the gate electrode 122, an interlayer insulating layer 14 is disposed on the CNT layer, the source electrode 123 and the drain electrode 124 are disposed on the interlayer insulating layer 14, and the source electrode 123 and the drain electrode 124 are electrically connected with the active layer 121 through holes respectively. A passivation layer 15 and a flat layer 16 are sequentially disposed on the source/drain electrodes. A pixel defining layer 17 is disposed on the flat layer 16, multiple light emitting regions corresponding to thin film transistors 12 one by one are defined in the pixel defining layer 17. The OLED element 18 includes a first electrode layer 181 located in a light emitting region, an organic light emitting layer 183 disposed on the first electrode layer 181, and a second electrode layer 182 disposed on the organic light emitting layer 183. The first electrode layer 181 is disposed on the flat layer 16, and the first electrode layer 181 is electrically connected to the source electrode 123 or the drain electrode 124 through a hole. Generally, the first electrode layer 181 is an anode layer, the second electrode layer 182 is a cathode layer, and the organic light emitting layer 183 emits light under an electric field of the first electrode layer 181 and the second electrode layer 182. The thin film encapsulation layer 19 is disposed on the second electrode layer 182. The thin film encapsulation layer 19 covers an entire light emitting surface of the display substrate panel. The thin film encapsulation layer 19 may prevent moisture and oxygen from invading the OLED element.

In an exemplary embodiment, as shown in FIG. 3, the light blocking layer 30 is disposed on the thin film encapsulation layer 19, and the light blocking layer 30 is located between two adjacent OLED elements. A thickness of the light blocking layer 30 is less than or equal to 1.5 um. The light blocking layer of this thickness will not affect an overall thickness of the display substrate panel, and a light and thin design of the panel is easy to realize. In order to make the light blocking layer 30 block light, a material of the light blocking layer 30 is an opaque material. Since a preparation process of the light blocking layer 30 is after a preparation process of the organic light emitting layer 183, in order to avoid damage to the organic light emitting layer 183 when the light blocking layer 30 is prepared, a process temperature when the light blocking layer 30 is formed is less than or equal to 100° C. In this way, the organic light emitting layer 183 will not be damaged when the light blocking layer 30 is formed, which ensures a quality of the display substrate panel. An opaque resin material by a low temperature manufacture procedure may be used for the light blocking layer.

Figure 6:
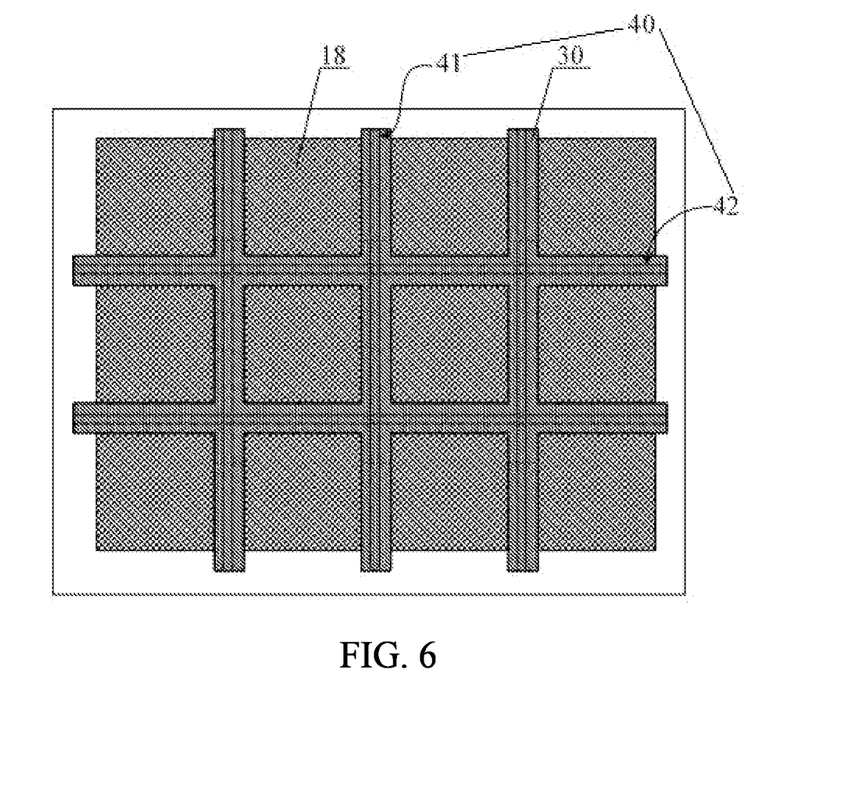
FIG. 6 is a schematic diagram of top view structure of a display substrate panel according to an embodiment of the present application.

FIG. 6 is a schematic diagram of top view structure of a display substrate panel in an exemplary embodiment. In an exemplary embodiment, metal traces are disposed between two adjacent OLED elements 18, that is, the metal traces are disposed between regions where the two adjacent OLED elements 18 are located. In FIG. 6, multiple OLED elements 18 are arranged in an array, a first metal trace 41 is disposed between two adjacent columns of OLED elements 18, and a second metal trace 42 is disposed between two adjacent rows of OLED elements. The metal trace may include a first metal trace 41, or the metal trace may include a second metal trace 42, or the metal trace may include a first metal trace 41 and a second metal trace 42. In order to prevent metal traces from being exposed due to light reflection when the display panel is viewed laterally, an orthographic projection of the light blocking layer 30 on the substrate 11 includes an orthographic projection of the first metal trace 41 on the substrate 11, and an orthographic projection of the light blocking layer 30 on the substrate 11 includes an orthographic projection of the second metal trace 42 on the substrate 11. Compared with the black matrix 22 of the cover panel 200, the light blocking layer 30 is closer to the first metal trace 41 and the second metal trace 42, so that the light blocking layer 30 may more effectively cover the first metal trace 41 and the second metal trace 42. When the display panel is viewed laterally, the metal trace may be prevented from reflecting light and being exposed, which improves a visual experience.

In an exemplary embodiment, as shown in FIG. 6, a quantity of the first metal trace 41 may be 2 and a quantity of the second metal trace 42 may be 2. It is easy to understand that the quantity of the first metal trace 41 is not limited to 2, but may be 1 or more, and the specific quantity may be set according to an actual requirement. Similarly, the quantity of the second metal trace 42 is not limited to 2, but may be 1 or more, and the specific quantity may be set according to an actual requirement. The first metal trace 41 is usually a data line, so the first metal trace 41 is usually disposed on the same layer as source/drain electrodes of a thin film transistor. The second metal trace 42 is generally a gate line, so the second metal trace 42 is generally disposed on the same layer as a gate electrode of the thin film transistor.

When the display panel is in operation, the OLED elements emit light, and a gap between two adjacent OLED elements does not emit light. In order to prevent scattered or reflected light of the gap from affecting the display, in an exemplary embodiment, as shown in FIGS. 4 and 6, an orthographic projection of the OLED elements 18 adjacent to the light blocking layer 30 on the substrate 11 is connected to or has an overlapping portion with an orthographic projection of the light blocking layer 30 on the substrate 11. That is, a width of the light blocking layer 30 is greater than or equal to the gap between the adjacent OLED elements 18. Such a light blocking layer 30 may completely cover a gap between two adjacent OLED elements to prevent scattered or reflected light of the gap from affecting the display of the display panel.

In an exemplary embodiment, the light blocking layer 30 is disposed on the display substrate panel, and the light blocking layer 30 may more effectively cover a gap between a metal trace and an adjacent OLED element. Compared with the black matrix of the cover panel, the light blocking layer 30 is closer to the OLED element, so that a width of the light blocking layer 30 may be smaller than a width of the black matrix of the cover panel, which may increase an aperture opening ratio of a display device.

A "patterning process" mentioned in the following embodiment includes processes such as coating photoresist, mask exposure, development, etching, stripping photoresist, and is an existing mature preparation process. Any process such as sputtering, evaporation, chemical vapor deposition, etc. may be used for deposition, any coating process may be used for coating, and any etching method may be used for etching, which is not specifically limited here.

Multiple organic light-emitting diode (OLED) elements 18 are formed on the substrate 11.

A thin film encapsulation layer 19 is formed on the OLED element 18.

A light blocking layer 30 is formed on the thin film encapsulation layer 19, and the light blocking layer 30 is located between two adjacent OLED elements 18.

In an exemplary embodiment, the thin film encapsulation layer 19 may include an inorganic thin film and an organic thin film.

In an exemplary embodiment, the light blocking layer 30 is formed at a temperature less than or equal to 100° C. The light blocking layer 30 may block light.

In an exemplary embodiment, a thickness of the light blocking layer 30 is less than or equal to 1.5 um.

Figure 7A:
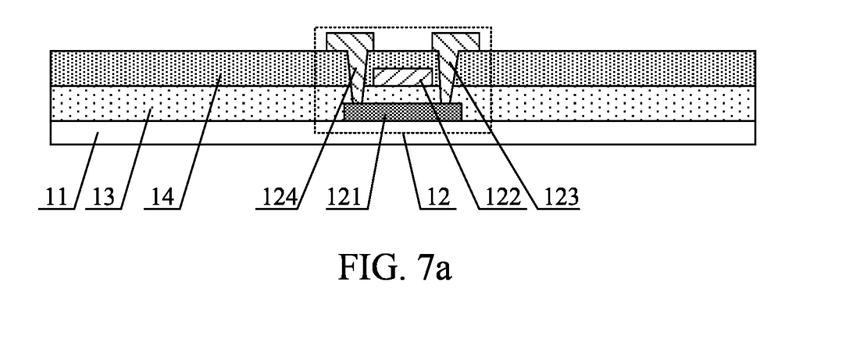
FIG. 7a is a schematic structural diagram of a display substrate panel after a thin film transistor is formed.
Figure 7B:
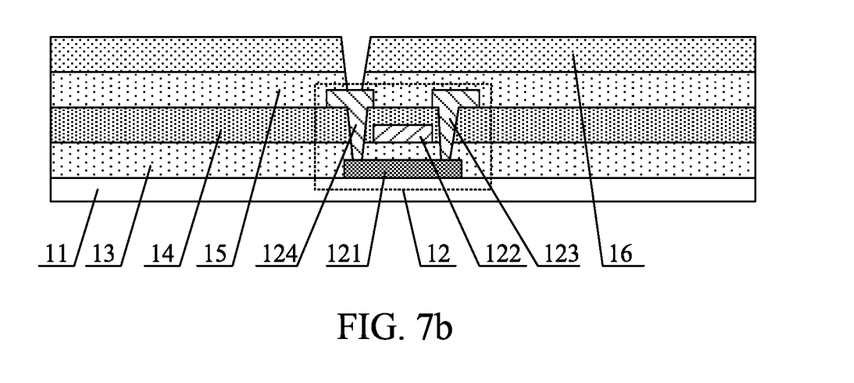
FIG. 7b is a schematic structural diagram of a display substrate panel after a flat layer is formed.
Figure 7C:
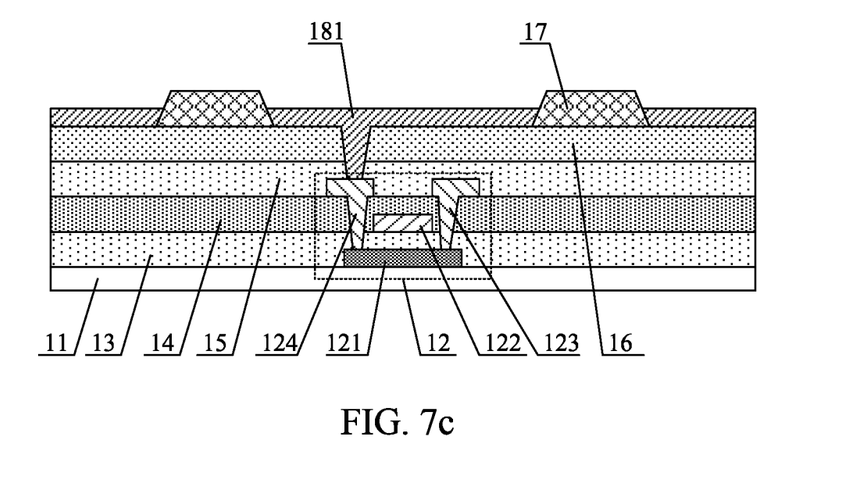
FIG. 7c is a schematic structural diagram of a display substrate panel after a first electrode layer is formed.
Figure 7D:
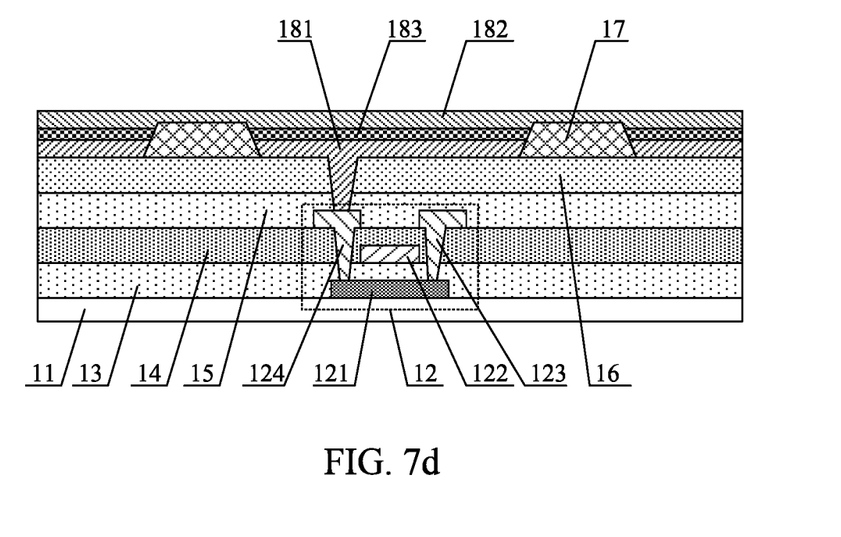
FIG. 7d is a schematic structural diagram of a display substrate panel after an OLED element is formed.

FIG. 7a is a schematic structural diagram of a display substrate panel after a thin film transistor is formed, FIG. 7b is a schematic structural diagram of a display substrate panel after a flat layer is formed, FIG. 7c is a schematic structural diagram of a display substrate panel after a first electrode layer is formed, and FIG. 7d is a schematic structural diagram of a display substrate panel after an OLED element is formed.

In an exemplary embodiment, forming multiple OLED elements 18 on the substrate 11 may include: forming a thin film transistor 12 on the substrate 11.

As shown in FIG. 7a, forming the thin film transistor 12 on the substrate 11 includes: sequentially forming a light shielding layer and a buffer layer (not shown in the figure) on the substrate 11, forming an active thin film on the buffer layer, forming an active layer 121 through a patterning process, sequentially forming a gate insulating thin film and a gate electrode thin film by deposition on a substrate on which the active layer 121 is formed, forming a gate electrode 122 by a patterning process, forming a CNT thin film (not shown in the figure) on a substrate on which the gate electrode 122 is formed, forming an interlayer insulating thin film on the CNT thin film, forming, by a patterning process, two holes passing through the interlayer insulating thin film, the CNT thin film and the gate insulating thin film so as to form a gate insulating layer 13, a CNT layer and an interlayer insulating layer 14, wherein the active layer 121 is exposed through the two holes, forming a source/drain thin film on the interlayer insulating layer 14, and forming a source electrode 123 and a drain electrode 124 by a patterning process, wherein the source electrode 123 and the drain electrode 124 are electrically connected to the active layer 121 through holes, respectively.

A passivation layer 15 and a flat layer 16 are sequentially formed on a substrate on which an active electrode and an drain electrode are formed, a passivation thin film and a flat thin film are sequentially formed on the substrate on which the active electrode and the drain electrode are formed, and holes passing through the passivation thin film and the flat thin film to expose the drain electrode 124 are formed by a patterning process, so that passivation layer 15 and the flat layer 16 are formed, as shown in FIG. 7b.

A pixel defining layer 17 and a first electrode layer 181 are formed on the flat layer 16. As shown in FIG. 7c, multiple light emitting regions are defined in the pixel defining layer 17, the first electrode layer 181 is located in the light emitting region, and the first electrode layer 181 is electrically connected to the drain electrode 124 through a hole, as shown in FIG. 7c. A material of the first electrode layer 181 may be Indium Zinc Oxide (IZO) or Indium Tin Oxide (ITO).

An organic light emitting layer 183 is formed on the first electrode layer 181, and the organic light emitting layer 183 is located in the light emitting region.

A second electrode layer 182 is formed on the substrate on which the organic light emitting layer 183 is formed, and the second electrode layer 182 may cover an entire upper surface of the substrate, as shown in FIG. 7d.

The OLED element 18 includes a first electrode layer 181, an organic light emitting layer 183, and a second electrode layer 182.

In an exemplary embodiment, forming a light blocking layer 30 on the thin film encapsulation layer 19 includes: forming a light blocking thin film on the thin film encapsulation layer 19, and performing exposure and development of the light blocking thin film by using a single-tone mask to form a pattern of the light blocking layer. Herein, a material of the light blocking layer is an opaque resin material by a low temperature manufacture procedure.

In an exemplary embodiment, the process temperature for forming the light blocking layer is less than or equal to 100° C. Forming the light blocking layer 30 at a temperature less than or equal to 100° C. may avoid damage to the organic light emitting layer in the process of forming the light blocking layer, ensuring a display quality of the display substrate panel.

An exemplary embodiment provides a display panel. As shown in FIG. 4, the display panel includes the display substrate panel 100 in the above embodiment and further includes a cover panel 200. The cover panel 200 and the display substrate panel 100 are aligned and combined into a cell, and an isolation column 300 is disposed between the cover panel 200 and the display substrate panel 100. The cover panel 200 includes a second substrate (not shown in the figure) and a color film layer 21 disposed on a side of the second substrate facing the display substrate panel. The color film layer 21 includes a red color film (R), a green color film (G), and a blue color film (B) disposed to correspond to the light emitting regions, so that pixels corresponding to the light emitting regions are formed on the display panel. A red pixel is located on the red color film (R), a green pixel is located on the green color film (G), and a blue pixel is located on the blue color film (B). The cover panel 200 further includes a protective layer 23 on a side of the color film layer 21 facing the display substrate panel 100. A material of the protective layer 23 may be a transparent organic material used for protecting the color film layer while making a surface on a side of the cover panel facing the display substrate panel more flat.

In order to prevent the isolation column 300 from affecting the display of the display panel, in an exemplary embodiment, an orthographic projection of the isolation column 300 on the substrate 11 is within a range of an orthographic projection of the light blocking layer 30 on the substrate 11.

In an exemplary embodiment, a light blocking layer 30 is disposed on the display substrate panel 100. The light blocking layer 30 may block light leakage between adjacent OLEDs so that the cover panel 200 may be provided with no black matrix, and this simplifies a manufacturing procedure process of the cover panel 200. The light blocking layer 30 is disposed on the display substrate panel 100. After the cover panel and the display substrate panel are aligned and combined into a cell, even if there is a slight location alignment deviation between the cover panel 200 and the display substrate panel, a separation role of the light blocking layer 30 between two adjacent OLED elements will not be affected. Therefore, light emitted by the OLED elements may always shine on corresponding color films, and light leakage of adjacent pixels caused by the location alignment deviation is avoided. Therefore, the slight location alignment deviation between the cover panel 200 and the display substrate panel does not affect the display of pixels, which makes colors displayed by the pixels purer.

In an exemplary embodiment, the cover panel may further include a black matrix located between adjacent color films. The black matrix of the cover panel and the light blocking layer on the display substrate panel work together to reduce light leakage of adjacent pixels, reduce color deviation of pixels, and reduce the color cast.

In an exemplary embodiment, the display panel may be any product or component with display function such as a mobile phone, a tablet computer, a television, a display, a notebook computer, a digital photo frame, a navigator, etc.

In the description of the present application, it should be understood that, azimuth or positional relationships indicated by terms "upper", "lower", "front", "rear", "top", "bottom" and the like is based on the azimuth or positional relationship shown in the drawings, which is only for ease of description of the present application and simplification of the description, rather than indicating or implying that the device or element referred to must have a specific orientation, or must be constructed and operated in a particular orientation, and therefore cannot be construed as limiting the present application.

In the description of the present application, it should be noted that, unless expressly specified and defined otherwise, a term "connected" should be broadly understood, and it may be directly connected or indirectly connected through an intermediate medium. The meaning of the above term in the present application may be understood by those of ordinary skill in the art in light of specific circumstances.

Although embodiments of the present application are described in the above, the above embodiments are described only for better understanding, rather than restricting the present application. Any person skilled in the art can make any modifications and variations in the form and details of implementation without departing from the spirit and scope of the present application. The protection scope of the present application shall be determined by the scope as defined in the claims.

What we claim is:

1. A preparation method for a display panel, comprising:
   forming a display substrate panel and a cover panel which is aligned and combined into a cell with the display substrate panel; and
   forming an isolation column disposed between the display substrate panel and the cover panel;
   wherein forming the display substrate panel comprises:
   forming multiple organic light-emitting diode (OLED) elements on a base substrate;
   forming a thin film encapsulation layer on the OLED elements; and
   forming a light blocking layer on the thin film encapsulation layer, wherein
   the light blocking layer is located between two adjacent OLED elements, and thickness of the light blocking layer is less than or equal to 1.5 um;
   the light blocking layer is formed at a process temperature less than or equal to 100° C.;
   forming the light blocking layer on the thin film encapsulation layer comprises: forming a light blocking thin film on the thin film encapsulation layer; and performing exposure and development of the light blocking thin film by using a single-tone mask, to form a pattern of the light blocking layer;
   metal traces are located between two adjacent OLED elements and disposed between the OLED elements and the base substrate, and an orthographic projection of the light blocking layer on the base substrate includes an orthographic projection of the metal traces on the base substrate;
   forming the cover panel which is aligned and combined into the cell with the display substrate panel comprises: forming a color film layer disposed on a side of a second substrate of the cover panel facing the display substrate panel; and
   forming the isolation column disposed between the display substrate panel and the cover panel comprises: forming the isolation column disposed between the light blocking layer of the display substrate panel and a protection layer of the cover panel, wherein the isolation column is in contact with the light blocking layer of the display substrate panel, and an orthographic projection of the isolation column on the base substrate is within a range of an orthographic projection of the light blocking layer on the base substrate.

2. A display panel prepared according to a preparation method, wherein the preparation method comprises:
   forming a display substrate panel and a cover panel which is aligned and combined into a cell with the display substrate panel; and
   forming an isolation column disposed between the display substrate panel and the cover panel;
   wherein forming the display substrate panel comprises:
   forming multiple organic light-emitting diode (OLED) elements on a base substrate;
   forming a thin film encapsulation layer on the OLED elements; and
   forming a light blocking layer on the thin film encapsulation layer, wherein
   the light blocking layer is located between two adjacent OLED elements, and thickness of the light blocking layer is less than or equal to 1.5 um;

the light blocking layer is formed at a process temperature less than or equal to 100° C.;

forming the light blocking layer on the thin film encapsulation layer comprises: forming a light blocking thin film on the thin film encapsulation layer; and performing exposure and development of the light blocking thin film by using a single-tone mask, to form a pattern of the light blocking layer;

metal traces are located between two adjacent OLED elements and disposed between the OLED elements and the base substrate, and an orthographic projection of the light blocking layer on the base substrate includes an orthographic projection of the metal traces on the base substrate;

forming the cover panel which is aligned and combined into the cell with the display substrate panel comprises: forming a color film layer disposed on a side of a second substrate of the cover panel facing the display substrate panel; and forming the isolation column disposed between the display substrate panel and the cover panel comprises: forming the isolation column disposed between the light blocking layer of the display substrate panel and a protection layer of the cover panel, wherein the isolation column is in contact with the light blocking layer of the display substrate panel, and an orthographic projection of the isolation column on the base substrate is within a range of an orthographic projection of the light blocking layer on the base substrate.

3. The display panel according to claim 2, wherein an orthographic projection of the OLED element, which is adjacent to a region where the light blocking layer is located, on the base substrate is connected to or has an overlapping part with an orthographic projection of the light blocking layer on the base substrate.

4. The display panel according to claim 2, the color film layer has a red color film, a green color film and a blue color film which are disposed to correspond to the OLED elements.

* * * * *